United States Patent
Williams et al.

(10) Patent No.: US 9,182,454 B1
(45) Date of Patent: Nov. 10, 2015

(54) STEERED-ELECTRON ELECTRIC-FIELD (SEEF) SENSOR PROGRAM

(75) Inventors: Kirt Reed Williams, Portola Valley, CA (US); Scott Limb, Palo Alto, CA (US); Dirk De Bruyker, San Jose, CA (US)

(73) Assignees: Leidos, Inc., Reston, VA (US); Palo Alto Research Center Incorporated, Palto Alto, CA (US)

( * ) Notice: Subject to any disclaimer, the term of this patent is extended or adjusted under 35 U.S.C. 154(b) by 854 days.

(21) Appl. No.: 13/468,801

(22) Filed: May 10, 2012

Related U.S. Application Data

(60) Provisional application No. 61/484,505, filed on May 10, 2011.

(51) Int. Cl.
G01R 33/02 (2006.01)
G01R 1/04 (2006.01)
G01R 15/26 (2006.01)

(52) U.S. Cl.
CPC .............. G01R 33/0213 (2013.01); G01R 1/04 (2013.01); G01R 15/26 (2013.01)

(58) Field of Classification Search
CPC .......................... G01R 15/26; G01R 33/0213
See application file for complete search history.

(56) References Cited

U.S. PATENT DOCUMENTS

2003/0049899 A1* 3/2003 Syms ...................... H01J 1/304 438/200
2004/0067602 A1* 4/2004 Jin ......................... B82Y 10/00 438/22

FOREIGN PATENT DOCUMENTS

JP 11-218568 * 8/1999

OTHER PUBLICATIONS

Williams, Kirt Reed, "Micromachined Hot-Filament Vacuum Devices," Ph.D. Dissertation, Department of Electrical Engineering and Computer Sciences, University of California, Berkeley, 1997.
Williams, Kirt Reed, vol. I—Technical Proposal, Electric Field Detector (E-FED) BAA 09-34, Jun. 5, 2009, 55 pp.
C. C. Enz and G. Temes, "Circuit Techniques for Reducing the Effects of Op-Amp Imperfections: Autozeroing, Correlated Double Sampling and Chopper Stabilization," Proc. IEEE, vol. 84, Nov. 1996, pp. 1584-1613.

(Continued)

*Primary Examiner* — David Porta
*Assistant Examiner* — Mindy Vu
(74) *Attorney, Agent, or Firm* — Dawn-Marie Bey; Bey & Cotropia PLLC

(57) ABSTRACT

Improved electric field (steered-electron electric-field, or SEEF) sensors and methods of manufacturing the same are provided. The SEEF sensors described herein may have increased sensitivity to low-frequency electric fields while being smaller than previously known sensors, and may allow for low-power electric field detection. The invention described herein allows for sensitive, long-term electric field monitoring for applications ranging from personnel detection to underground facility monitoring, as well as extraordinarily small vector sensing (full Poynting vector) for compact direction-finding of emitters of interest. Exemplary electric field sensors may accurately sense, measure, characterize and/or transmit electric field data over a wide frequency range. Importantly, such sensing, measuring, and/or characterizing do not require any physical or resistive contact between the sensor and a source of an electric field.

60 Claims, 9 Drawing Sheets

(56) References Cited

OTHER PUBLICATIONS

A. Chen, et al., "Microring Resonators made in Poled and Unpoled Chromophore-Containing Polymers for Optical Communication and Sensors," IEEE J. Selected Topics Quant. Elect., vol. 14, No. 5, 2008, pp. 1281-1288.

Industry Canada, "Immunity of Electrical/Electronic Equipment Intended to Operate in the Canadian Radio Environment (0.010-10,000 MHz)," EMCAB-1, Issue 3, Jun. 1990. Available online at 222.ic.gc.ca/eic/site/smt-gst.nsf/vwapj/emcab1.pdf/$FILE/emcab1.pdf.

C. R. Hammond, "The Elements," in CRC Handbook of Chemistry and Physics, $65^{th}$ Ed., 1984-1985, Robert C. Weast, ed., CRC Press, Boca Raton, Florida, 1984, pp. B-5 to B-43.

L. Dalton, "Photonic Integration Improves on Current Technologies," SPIE Newsroom, Oct. 7, 2007.

Y. Enami, et al., "Hybrid Polymer/Sol-Gel Waveguide Modulators with Exceptionally Large Electro-Optic Coefficients," Nature Photonics, vol. 1, 2007, pp. 180-185.

Austin V. Eastman, "Fundamentals of Vacuum Tubes," McGraw-Hill, New York, 1941, p. 14.

R. Forber, R., et al., "Dielectric EM Field Probes for HPM Test and Evaluation," 2006 Annual ITEA Technology Review, Cambridge, Mass., Available at http://www.ipitek.com/Technology/White/research_diaeletric.pdf.

Paul R. Gray and Robert G. Meyer, "Analysis and Design of Analog Integrated Circuits," $2^{nd}$ Ed., Wiley, New York, 1984, Ch. 11.

Jin, Feng, et al., "Enhanced Thermionic Emission From Barium Strontium Oxide Coated Carbon Nanotubes," Proc. IEEE Intl. Vacuuum Elec. Conf. (IVEC '07), May 15-17, 2007.

Y. J. Rao, et al., "Electro-Optic Electric Field Sensor Based on Periodically Poled $LiNbO_3$," Electronics Letters, vol. 35, No. 7, Apr. 1, 19999, pp. 596-597.

D. Runde, et al., Integrated Optical Electric Field Sensor Based on a Bragg Grating in Lithium Niobate, Applied Physics B—Lasers and Optics, vol. 86, 2007, pp. 91-95.

Karl. R. Spangenberg, "Vacuum Tubes," McGraw-Hill, New York, 1948.

"Low-Noise Current Preamplifier: SR570," datasheet, Stanford Research Systems, Sunnyvale, California, 2009.

S. S. Sriram and S. A. Kingsley, S.A., "Sensitivity Enhancement to Photonic Electric Field Sensor," SPIE DSS, 2004. Available at http://www.srico.com/files/SPIE%20DSS%202004%20E-sensor.pdf.

S. Takahashi, et al., "Photo-Stability Measurement of Electro-Optic Polymer Waveguides with High Intensity at 1550-nm Wavelength," J. Lightwave Tech., vol. 27, No. 8, 2009, pp. 1045-1050.

Richard E. Thomas, et al., "Thermionic Sources for High-Brightness Electron Beams," IEEE Transactions on Electron Devices, vol. 37, No. 3, Mar. 1990, pp. 850-861.

Wikipedia Encyclopedia, Work Function Web site, http://en.wikipedia.org/wiki/Work_function, retrieved May 22, 2009.

Hei Wong, "Low-Frequency Noise Study in Electron Devices: Review and Update," Microelectronics Reliability, vol. 43, 2003, pp. 585-599, quoting: J. B. Johnson, Physical Review, vol. 29, 1927, p. 367.

John P. Verboncoeur, et al., "Simultaneous Potential and Circuit Solution for 1D Bounded Plasma Particle Simulation Codes," J. Comp. Physics, vol. 104, pp. 321-328, Feb. 1993.

P. Young, "Electro-Optic E-Field Sensors for Shielding Measurements up to 18 GHz," IEEE, 1995, pp. 87-91.

* cited by examiner

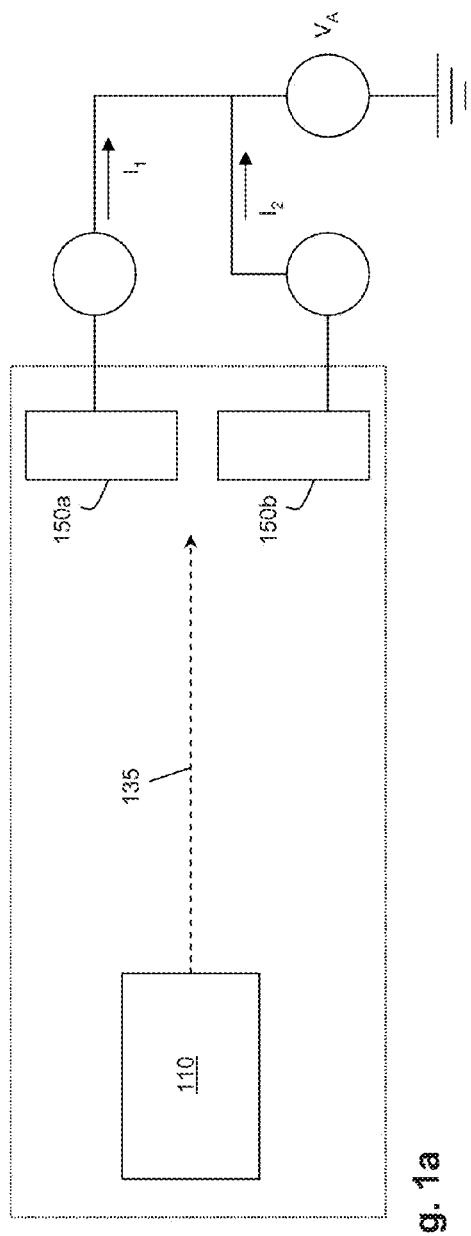
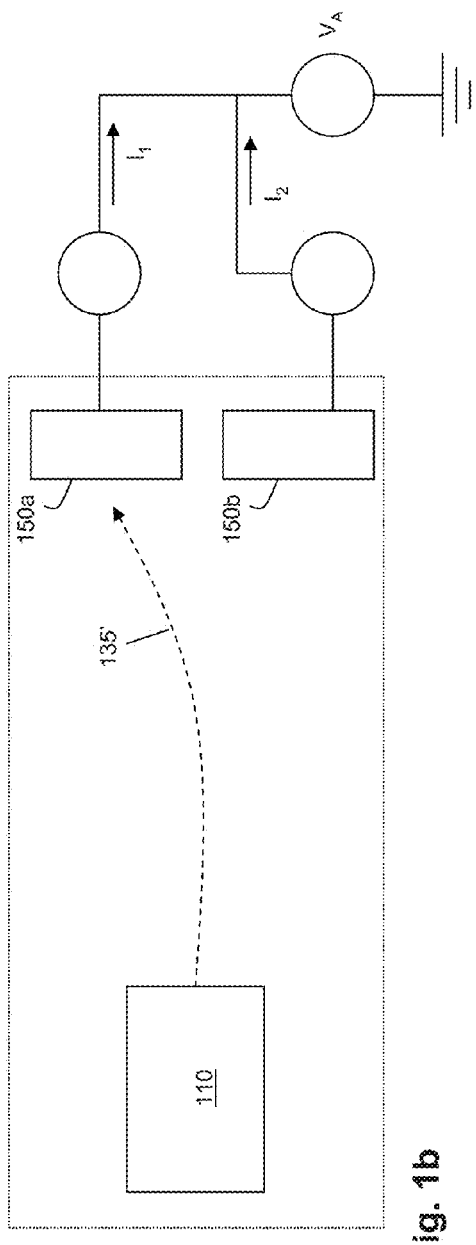
Fig. 1a
Fig. 1b

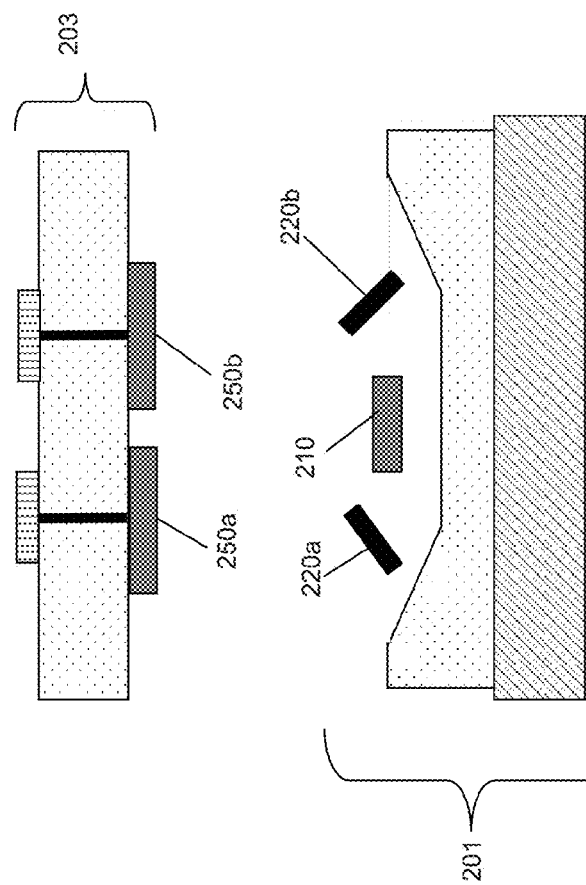
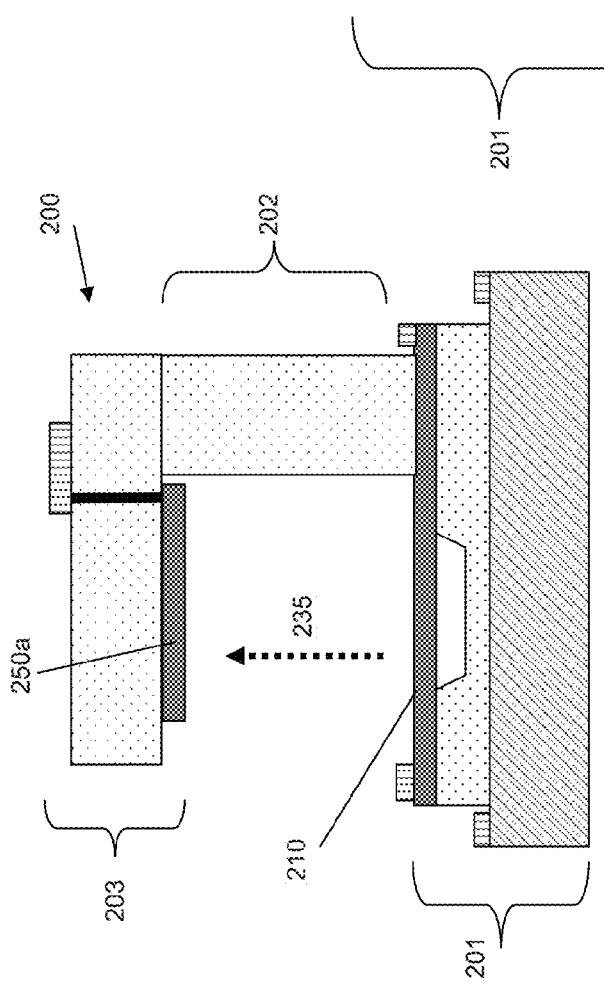

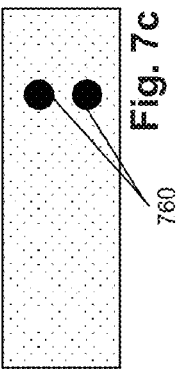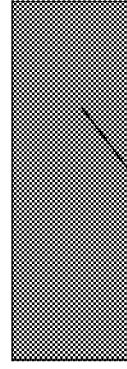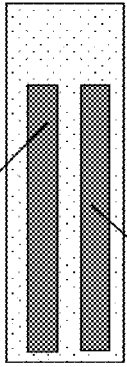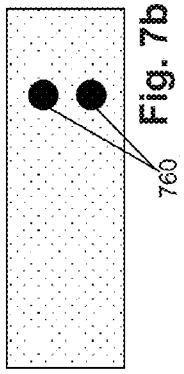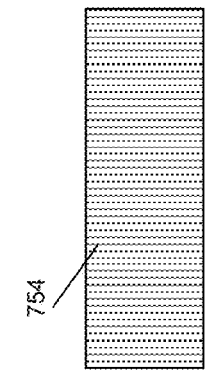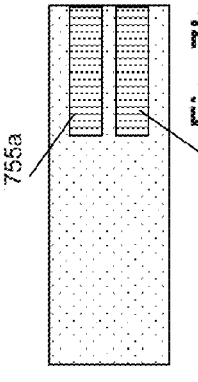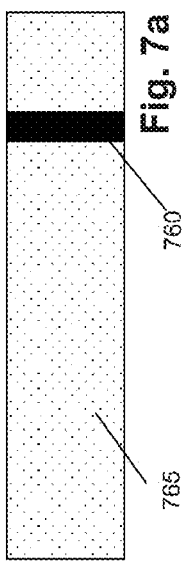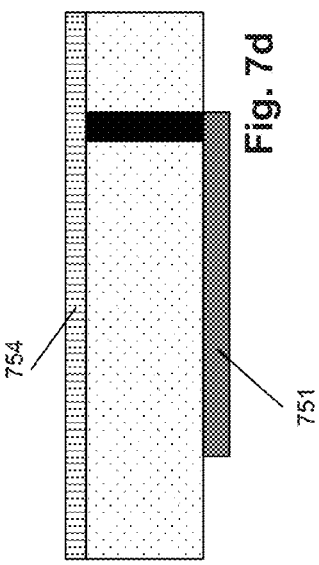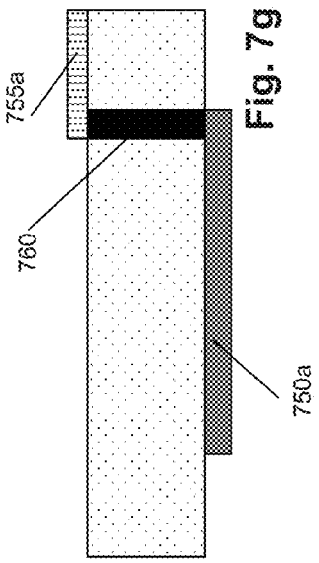

STEERED-ELECTRON ELECTRIC-FIELD (SEEF) SENSOR PROGRAM

CROSS-REFERENCE TO RELATED APPLICATIONS

The present application claims benefit of similarly titled U.S. provisional patent application Ser. No. 61/484,505, filed on May 10, 2011, which is incorporated herein by reference in its entirety.

GOVERNMENT RIGHTS STATEMENT

Certain embodiments herein were made with government support under contract No. HR0011-10-C-0046, awarded by the Defense Advanced Research Project Agency (DARPA). The government has certain rights in those embodiments.

FIELD OF THE INVENTION

The invention relates to novel electric field sensors and methods of manufacturing the same.

BACKGROUND

Historically, sensitive, low-frequency electric-field sensors have been large devices, employing pairs of widely separated antennae or probes coupled to high-impedance voltmeters. The size of the antenna scales with the wavelength of the electromagnetic wave length and small sensors based on electro-optic materials are only sensitive at higher frequencies. More recently, a number of antenna-less electro-optic sensors have been employed to detect electric fields. Although such systems may be more compact than antenna systems, they are insensitive at low frequencies (e.g., frequencies below 100 MHz).

Compact sensors capable of detecting small, low-frequency electric fields could be applied for low-distance detection of power lines and taking electroencephalograms (EEGs), among other uses. Sensors requiring low power are especially desirable for portable applications.

SUMMARY OF THE INVENTION

It is therefore a goal of the invention to provide an improved electric-field sensor and method of manufacturing the same. The electric-field sensors described herein may have increased sensitivity to electric fields while being smaller than previously known sensors, and may allow for low-power electric-field detection. The invention described herein allows for sensitive, long-term electric-field monitoring for applications ranging from personnel detection to underground facility monitoring. Exemplary electric-field sensors may accurately sense, measure, characterize and/or transmit electromagnetic field data over a wide frequency range. Importantly, such sensing, measuring, and/or characterizing do not require any physical or resistive contact between the senor and a source of an electromagnetic field.

In one aspect of the invention, a steered-electron electric-field sensor ("SEEF sensor") is provided. The SEEF sensor includes a bottom portion having: a non-conductive bottom portion support structure having a cavity disposed therein; a cathode capable of emitting electrons when activated (e.g., when heated, illuminated, and/or when an extraction electric field is applied), the cathode extending from the bottom portion such that it is at least partially suspended above the cavity, and the cathode comprised of a metal and optionally a low-work-function material or sharp tips; and a plurality of steering electrodes extending from a base at the bottom portion support structure to a tip located above the cathode. The SEEF sensor may also include a top portion having: a non-conductive top portion support structure; a first anode disposed on the top portion support structure; and a second anode disposed on top portion support structure, the second anode located a distance of from the first anode. The first and second anode may be symmetrically positioned above the cathode. The SEEF sensor may also include a middle portion extending from the top portion support structure to the bottom portion support structure such that the cathode is located from about 0.5 mm to about 5 mm from the first and second anode. Generally, upon activating the cathode, electrons are emitted therefrom, and said electrons form a "beam" that is received at the first and/or second anode. When an external electric field is applied perpendicular to the electron path from cathode to anodes, the electron beam may be shifted, resulting in more electron current to one of the anodes and less to the other anode.

In another aspect of the invention, an electric-field sensor package is provided. The package may include a base and lid sealably connected to form a hollow structure having an inner chamber therein. The package may also include a SEEF sensor disposed within the inner chamber. The SEEF sensor may include a generally free-standing cathode capable of emitting electrons when activated (e.g., when heated, illuminated, and/ or when an extraction electric field is applied). The cathode may be made of a metal and optionally a low-work-function material or sharp tips. The SEEF sensor may also include a first and second anode located a distance apart, the first and second anode symmetrically located from about 0.5 mm to about 5 mm from the cathode. The SEEF sensor may also include a plurality of steering electrodes at least partially disposed between the cathode and the first and second anode. Generally, upon activating (e.g., heating, illuminating, and/or application of an extraction field) the cathode, electrons are emitted therefrom, and said electrons form a "beam" that is received at the first and/or second anode. The package may also include electric field concentrators disposed within the inner chamber on two sides of the SEEF sensor, the electric field concentrators adapted to concentrate an external transverse electric field through the path of the electrons emitted from the cathode thereof.

In yet another aspect of the invention, a method of determining an external electric field is provided. The method includes providing a SEEF sensor. For example, the SEEF sensor may include a bottom portion having: a non-conductive bottom portion support structure having a cavity disposed therein; a cathode capable of emitting electrons when activated, the cathode extending from the bottom portion such that it is at least partially suspended above the cavity, and the cathode comprising a metal and optionally a low-work-function material or sharp tips; and a plurality of steering electrodes extending from a base at the bottom portion support structure to a tip located above the cathode. The SEEF sensor may also include a top portion having: a non-conductive top portion support structure; a first anode disposed on the top portion support structure; and a second anode disposed on top portion support structure. The first and second anode may be symmetrically positioned above the cathode and may be located a distance apart. The SEEF sensor may also include a middle portion extending from the top portion support structure to the bottom portion support structure such that the cathode may be located from about 0.5 mm to about 5 mm from the first and second anode. The method may also include activating the cathode such that electrons are emitted therefrom. Accordingly, the electrons may be received at the first and/or second anode, creating a current. The currents may be measured and compared to determine an external electric field.

These and other aspects of the invention will be better understood by reading the following detailed description and appended claims.

BRIEF DESCRIPTION OF THE DRAWINGS

Embodiments of the present invention are illustrated by way of example and are not limited to the following figures:

FIGS. 1a and 1b illustrate simplified schematic diagrams of an exemplary SEEF sensor;

FIG. 2a illustrates a cross-sectional side view of an exemplary SEEF sensor;

FIG. 2b illustrates a cross-sectional end view of an exemplary SEEF sensor;

FIGS. 4a, 4c, 4e, and 4g illustrate cross-sectional side views of the bottom portion at different steps in the method and FIGS. 4b, 4d, 4f, and 4h illustrate top views of the bottom portion at these same steps, respectively;

FIGS. 7a-7i illustrate an exemplary MEMS microfabrication method for producing a top portion of an exemplary SEEF sensor. FIGS. 7a, 7d, and 7g illustrate cross-sectional side views of the top portion at different steps in the method. FIGS. 7b, 7e, and 7h illustrate top views of the top portion at these same steps, respectively. FIGS. 7c, 7f, and 7i illustrate bottom views of the top portion at these same steps, respectively;

DETAILED DESCRIPTION

Figure 3:
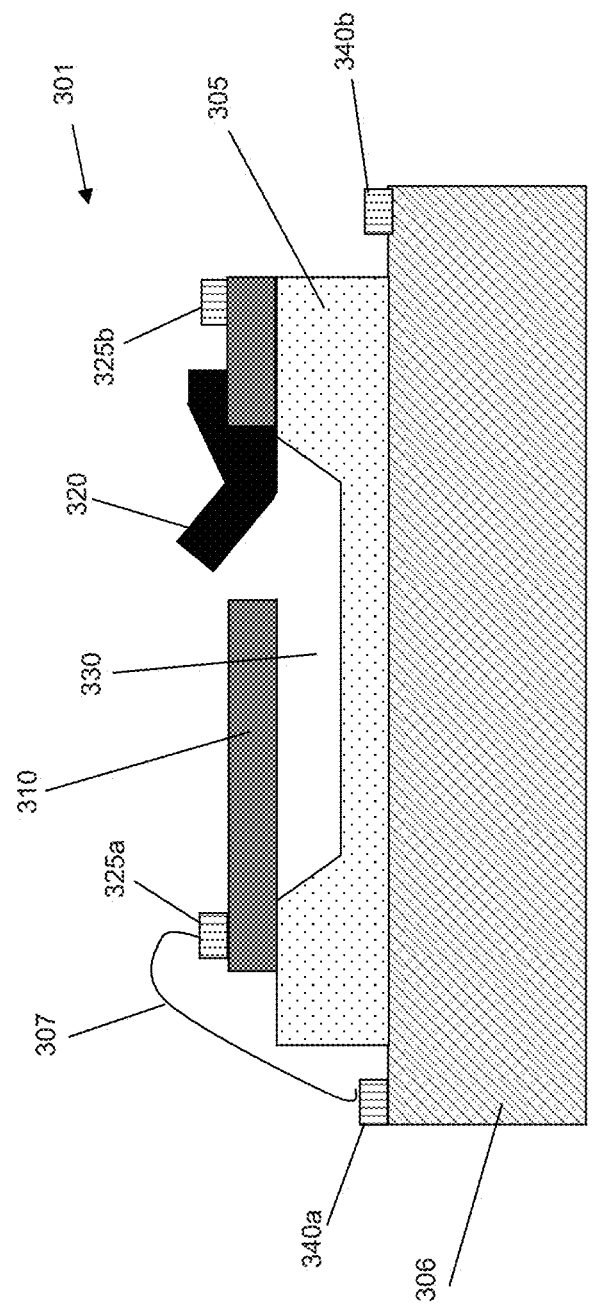
FIG. 3 illustrates a combined cross-sectional side and end view of a bottom portion of an exemplary E-FED sensor.

Various embodiments and aspects of the invention will be described with reference to details discussed below, and the accompanying drawings will illustrate the various embodiments. The following description and the drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions. All terms used herein are intended to have their ordinary meaning in the art unless otherwise provided.

Exemplary electric-field sensors described herein comprise a novel micromachined approach to extremely small, sensitive, and low-power electric-field detection. Embodiments of the inventive electric-field sensor couple MEMS fabrication technologies with a unique system design and advanced materials to provide sensors that outperform other approaches, such as but not limited to LiNbO$_3$ or EO-polymer-based solutions, in particular for critical low-frequency monitoring applications. The sensors described herein may enable sensitive, long-term electric-field monitoring for applications ranging from personnel detection to underground facility monitoring.

There are any number of uses for the electric-field sensors described herein. In one exemplary embodiment, the electric-field sensors described herein may be employed in large-scale distributed electric field monitoring systems, where a distributed network of electric-field sensor may monitor power supply activities along above-ground and shallow buried power lines. Such a network could detect perturbations in electric fields due to moving nearby objects such as cars or people. In another exemplary embodiment, the electric-field sensors described herein may be paired with magnetic-field sensors to determine full-field Poynting vectors. In yet another exemplary embodiment, because the described electric-field sensors are so small, they may be implemented in a wideband RF array direction finding. In another embodiment, the electric-field sensors may be employed to monitor electrostatic-discharge during manufacturing and handling of sensitive devices. In yet another embodiment, the electric-field sensors may used in medical and military applications for contactless electroencephalography, electrocardiography, electromyography and/or platform sensing.

As shown in Table 1, below, the electric-field sensors may be orders of magnitude smaller than conventional electric-field sensors and may provide unexpectedly low-frequency sensitivity without special signal processing to lower noise. The inventive electric-field sensors may allow for a wide electric field strength dynamic range, low cost, and low power (about 55 mW).

TABLE 1

| Parameter | Exemplary electric-field Sensor | A.R.A. Antenna w/High-Impd. Amp. | QUASAR Ant. w/High-Impd. Amp. | IPITEK MZI EO-polymer |
|---|---|---|---|---|
| Sensitivity (mV/m-Hz$^{1/2}$) | 1 | 0.01 @ 300Hz 0.00001 @ 0.5MHz | 300 @ 5 kHz 80 @ 0.3MHz | 70 |
| Lowest Freq. (Hz) | 10 | 100 | 5 × 10$^3$ | 2 × 10 |
| Highest Freq. (Hz) | 10$^8$ | 10$^9$ | 10$^6$ | 1.2 × 10$^{10}$ |
| Single Sensor Size | ≤10 mm$^2$ | d = 360 mm × h = 880 mm | >200 mm | 30 mm × 12 mm |

Referring to FIGS. 1a and 1b, a schematic of an exemplary electric-field sensor is illustrated. As shown, an electron emitter (cathode) 110 may be activated to emit electrons. A symmetrical pair of electron collectors (anodes) (150a, 150b) is present such that each anode is spaced about a micrometer away from the other. The anodes (150a, 150b) may have equal positive voltages (e.g., from about 50 V to about 200 V) applied thereto such that the electrons emitted from the cathode 110 are attracted toward them, forming a beam of electrons 135 (shown as dotted lines) from about 10 to about 300 μm wide (e.g., about 100 μm). The beam of electrons 135 collected at the anodes (150a, 150b) form currents ($I_1$, $I_2$) in the anodes in the 1-100 gA range. In the absence of an external electric field, the currents at the two anodes are equal (i.e., $I_1=I_2$), ignoring small offsets that may be accounted for.

Referring to FIG. 1b, an applied electric field transverse to the direction of electron beam travel will cause the electron beam 135' to be deflected, resulting in a greater current $I_1$ at one anode 150a and smaller current $I_2$ at the other 150b (the response is generally only to the transverse vector of the field). The difference between these currents (i.e., $I_2-I_1$) is proportional to the applied field strength.

In order to determine characteristics of an external electric field, amplifiers (e.g. transimpedance amplifiers, which convert current signals to voltage signals) may be employed to convert received currents ($I_1$ and $I_2$) to voltages and to correct for noise. The amplifiers may be compact and, in some embodiments, may be placed on the same board as the sensor.

Referring to FIGS. 2a and 2b, a cross-sectional side view and cross-sectional end view of an exemplary SEEF sensor 200 according to the invention are illustrated, respectively. As shown, a SEEF sensor may comprise a bottom portion 201, which is connected to a top portion 203 by a middle portion 202. As will be explained in detail, the bottom portion 201 comprises a free-standing cathode 210 surrounded by steering electrodes (220a, 220b). The top portion 203 comprises an anode pair (250a, 250b), such that electrons 235 released from the cathode may be directed to the anodes.

As shown, the SEEF sensor 200 is comprises a middle portion 202. The middle portion may comprise a glass (or any other non-conductive material) of a predetermined size such that the bottom portion 201 is separated from the top portion 203 by a distance equal to the length of the middle portion. In this way, electrons traveling from the cathode-containing bottom portion 201 may travel a predetermined distance (about the middle portion length) before reaching the anode-containing top portion 203. The middle portion 202 may comprise a length of from about 0.5 mm to about 5 mm.

Generally, the top portion 203 may be bonded to the middle portion 202 by any attaching means, such as but not limited to a high-temperature adhesive. Similarly, the middle portion 202 may be bonded to the bottom portion 201, by any attaching means.

Referring to FIG. 3, a cross-sectional combined side and end view of an exemplary bottom portion 301 of an embodiment of an SEEF sensor is illustrated. As shown, the bottom portion 301 comprises a free-standing cathode 310. Generally, the cathode material is electrically conductive and may be tied to ground or another voltage so that electrons can replenish those that have left the cathode. The cathode 310 should be suitable for operation at thermionic-emission temperatures (if thermionic emission is the method of electron activation) and further should not degrade too quickly in an imperfect vacuum. In certain embodiments, the cathode 310 may comprise one or more metals, such as but not limited to refractory (high-melting point) metals like tungsten, molybdenum, rhenium, osmium, iridium, tantalum, and/or niobium. Of these, tungsten and iridium are currently preferred, as tungsten is the highest-melting-point metal (but oxidizes upon exposure to air) and iridium is the highest-melting-point metal that is known to be inert at high temperature. In another embodiment, the cathode may comprise a non-refractory metal, such as but not limited to nickel. In any event, the cathode material should be commercially available to reduce costs. In certain embodiments, the cathode 310 may comprise a length of from about 0.5 mm to about 2 mm (e.g., about 1 mm) and a width of from about 10 μm to about 50 μm (e.g., about 20 μm).

In preferred embodiments, an exemplary SEEF sensor cathode 310 may comprise a low-work-function material in addition to a metal material. Accordingly, the refractory metal of the cathode 310 may be coated, mixed and/or impregnated with one or more low-work-function materials selected from the group consisting of thorium (Th), thorium oxide ($ThO_2$), barium (Ba), barium oxide (BaO), strontium (Sr), strontium oxide (SrO), calcium oxide (CaO), lanthanum (La), lanthanum oxide ($La_2O_3$), yttrium (Y), yttrium oxide ($Y_2O_3$), cesium (Ce), cesium oxide ($CeO_2$) and combinations thereof. Currently preferred coating/impregnating low-work-function materials are BaO, SrO, CaO, La, $La_2O_3$, and/or combinations thereof. Combinations of metals and a low-work-function materials worth mention are tungsten in combination with La and/or $La_2O_3$.

In certain embodiments, the low-work-function material may not be electrically conductive, and RF sputtering may be employed.

The amount and type of low-work-function material may be selected such that the coated and/or impregnated cathode 310 may produce the same electron emission current density as an otherwise identical cathode without coating and/or impregnation, but at a temperature that is reduced by 20% or greater, more preferably a temperature that is reduced by about 30% or greater, more preferably still a temperature that is reduced by about 40% or greater, and most preferably a temperature that is reduced by about 50% or greater. For example, a cathode 310 may be made from about 95% to about 99% by weight metal material and from about 1% to about 5% by weight impregnation or coating material. In one preferred embodiment, a cathode may comprise about 98% metal material and about 2% low-work-function material.

Although not shown, the cathode 310 may be activated to emit electrons. As used herein, the term "activate" refers to any means of manipulating the cathode to emit electrons. Exemplary activation techniques include, but are not limited to, heating the cathode, illuminating the cathode, and/or applying an extraction electric field to the cathode such that it may emit electrons. With respect to heating, any method may be employed, including but not limited to resistive (Joule) heating and absorption of intense optical radiation (e.g., from a laser). It has been found that the simplest method is resistive heating of a cathode filament by flowing current through it. With respect to the application of an external electric field, any such field capable of activating the cathode may be employed, and typically such field may be about 1000 V/μm or greater.

Figure 4:
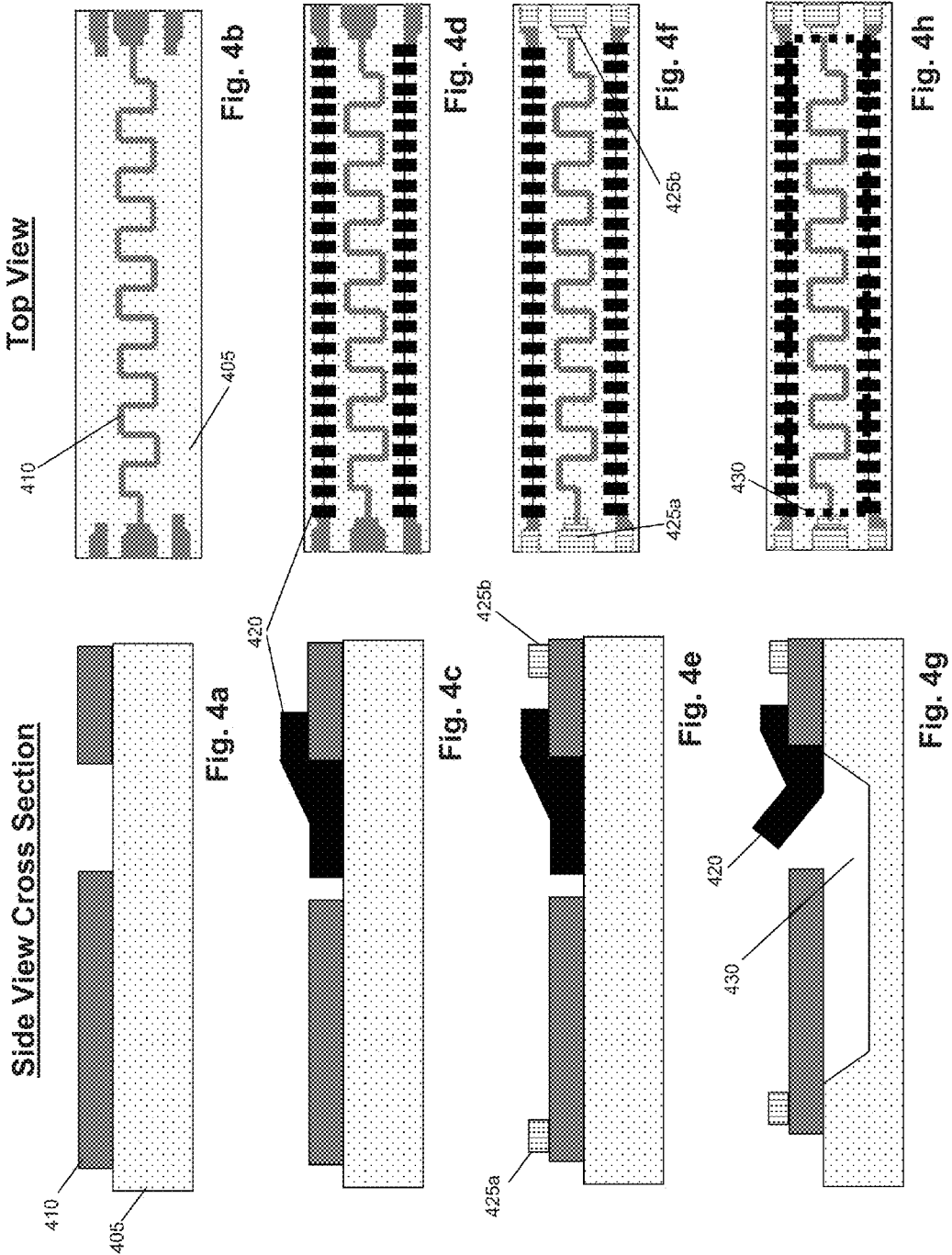
FIGS. 4a-4h illustrate an exemplary MEMS microfabrication method for producing a bottom portion of an exemplary SEEF sensor.

To minimize heat conducted away from the cathode 310, it may be fabricated as a freestanding filament. Freestanding filaments may lower heat loss and improve reliability if the micromachined cathode material has a different rate of thermal expansion than the support membrane. However, a freestanding filament typically requires that low-stress cathode metal be deposited and that stress relief is accounted for due to thermal expansion, as seen in, e.g., FIGS. 4 and 5.

Still referring to FIG. 3, the cathode is supported by a bottom portion support structure 305, which may comprise any nonconductive material, such as but not limited to soda lime glass, borosilicate glass, and/or fused quartz. In certain embodiments, the support structure 305 may comprise an alkali free borosilicate glass, such as but not limited to Corning® 1737 glass. In certain embodiments, the bottom portion support structure 305 may have a length of from about 1 to about 10 mm, for example about 5 mm, and may have a width of about 1 to about 5 mm, more specifically about 2 mm.

The support structure 305 is shown to be etched away below at least a portion of the cathode to form a cavity 330. In this way, the heat conducted away from the cathode 310 into the support structure 305 is minimized. In certain embodiments, the cavity 330 may be etched from about 10 to about 500 μm into or through the glass 305, and more particularly about 20 μm deep. The cavity 330 should be formed such that the cathode 310 does not touch the support structure 305, even when the cathode expands during heating.

Although many metal oxides are etched in hydrofluoric acid (HF) solutions, a low-work-function material of the cathode 310 may be impervious to HF and a variety of other available wet etchants. Accordingly, such materials may not require protection during a cavity etch in HF or a buffered hydrofluoric acid (BHF). Moreover, patterning of such materials may b done via liftoff.

During operation, as the negatively charged electrons leave the cathode 310, mutual repulsion tends to spread them apart, widening the desired beam. Accordingly, it may be desirable to employ steering electrodes 320 on either side of the cathode 310 to shape the electron beam. The steering electrode 320 may have a positive or negative voltage applied thereto such that the current in the electron beam may be increase, or so that the beam of free electrons may be narrowed. For example, if the anodes are driven to about 100 V and the tips of the steering electrode are about 50 μm apart, the steering electrodes 320 may be biased at about +10 V.

In one embodiment, the steering electrodes 320 may comprise a metal, such as but not limited to molybdenum-chromium (MoCr) alloy, or any other material capable of maintaining a stress gradient throughout its thickness. The steering electrodes 320 may range from about 5 to about 15 μm in width (e.g., about 10 μm) and may be spaced about 10 μm apart. The tips may be connected together with the same material. In one embodiment, the steering electrodes 320 may have a length of about 50 μm and may curl up from a base located at the support structure 305 to a tip such that at least a portion of a steering electrode lays above the plane of the cathode 310. Although not shown, any number of steering electrodes may be employed throughout the length of the bottom portion 301 of the SEEF sensor.

As shown in FIGS. 2 and 3, a support structure 305 may be bonded to a printed circuit board (PCB) 306 with, for example, epoxy or any other suitable adhesive. The cathode 310 may be placed in electrical communication with metallic pads (340a, 340b) on the PCB (e.g., via a wire 307). As shown, a wire 307 may connect a cathode bond pad 325a to a PCB metallic pad 340a. In this way, the cathode 310 may be placed in electrical communication with any circuitry (e.g., heating circuitry) that is also in electrical communication with the metallic pad.

Referring to FIGS. 4a-4h, a MEMS microfabrication technique for producing a bottom section (e.g., FIG. 3 at 301) of an exemplary SEEF detector is illustrated. There are a number of factors to consider during microfabrication for electronics or MEMS. For example, layers of materials must be deposited with a sufficiently low stress that they do not delaminate. Low stress is also required when creating suspended structures to prevent facture buckling.

Film deposition via evaporation may not allow for sufficient stress control. Accordingly, in one embodiment, cathode materials and/or steering electrode materials may be deposited using DC-magnetron sputtering. Such a technique allows for adequate stress control with many materials, such as but not limited to tungsten and/or iridium for the cathode 410 and/or steering electrodes 420.

As shown in FIGS. 4a-4b, a refractory metal may be deposited onto a glass wafer 405. The refractory metal may be patterned to form a cathode 410 having a shape. For example, the metal may be patterned into a serpentine-like design as shown. Such a design may allow for a comparable electron emission current while producing less thermal stress than other designs.

As discussed above, the cathode 410 may comprise a metal material coated, impregnated or mixed with a low-work-function material. For example, a cathode 410 may comprise a mixture of tungsten and lanthanum and/or lanthanum oxide. In certain embodiments, a metal oxide, low-work-function material may be reduced with suitable heating, causing the low-work-function metal to diffuse to the surface of the metal material. In other embodiments, a low-work-function metal (or metal oxide) may be deposited on the surface of a metal material.

As shown in FIGS. 4c and 4d, a layer of metal may be deposited onto the glass support structure, and then later patterned and lifted-off to form steering electrodes 420. In one embodiment, steering electrodes may comprise molybdenum-chromium (MoCr) alloy such that, when lifted-off, the steering electrodes experience a stress gradient through its thickness.

Referring to FIGS. 4e and 4f, a conductive material may be deposited and etched to form a pair of bond pads (425a, 425b). The bond pads (425a, 425b) may be made of any suitable conductive material, such as but not limited to gold, silver, or platinum. As discussed above, the bond pads (425a, 425b) may be placed in electrical communication (e.g., via one or more wires) with other electronics of a SEEF sensor.

Referring to FIGS. 4g and 4h, a photoresist layer may be deposited onto the support structure 405, patterned, and wet etched (e.g., using HF or BHF in a 6:1 solution) to form a cavity 430 under the cathode 410 such that the cathode filament is at least partially freed from the support structure. In certain embodiments, a pre-etch dip in surfactant, and/or agitation during etching may be employed to help remove bubbles and to keep the etch front wetted. This may result in a uniformly etched cavity 430. As shown, the steering electrodes 420 curl upwards, away from the cavity, and extend above the horizontal plane of the cathode 410.

Figure 5:
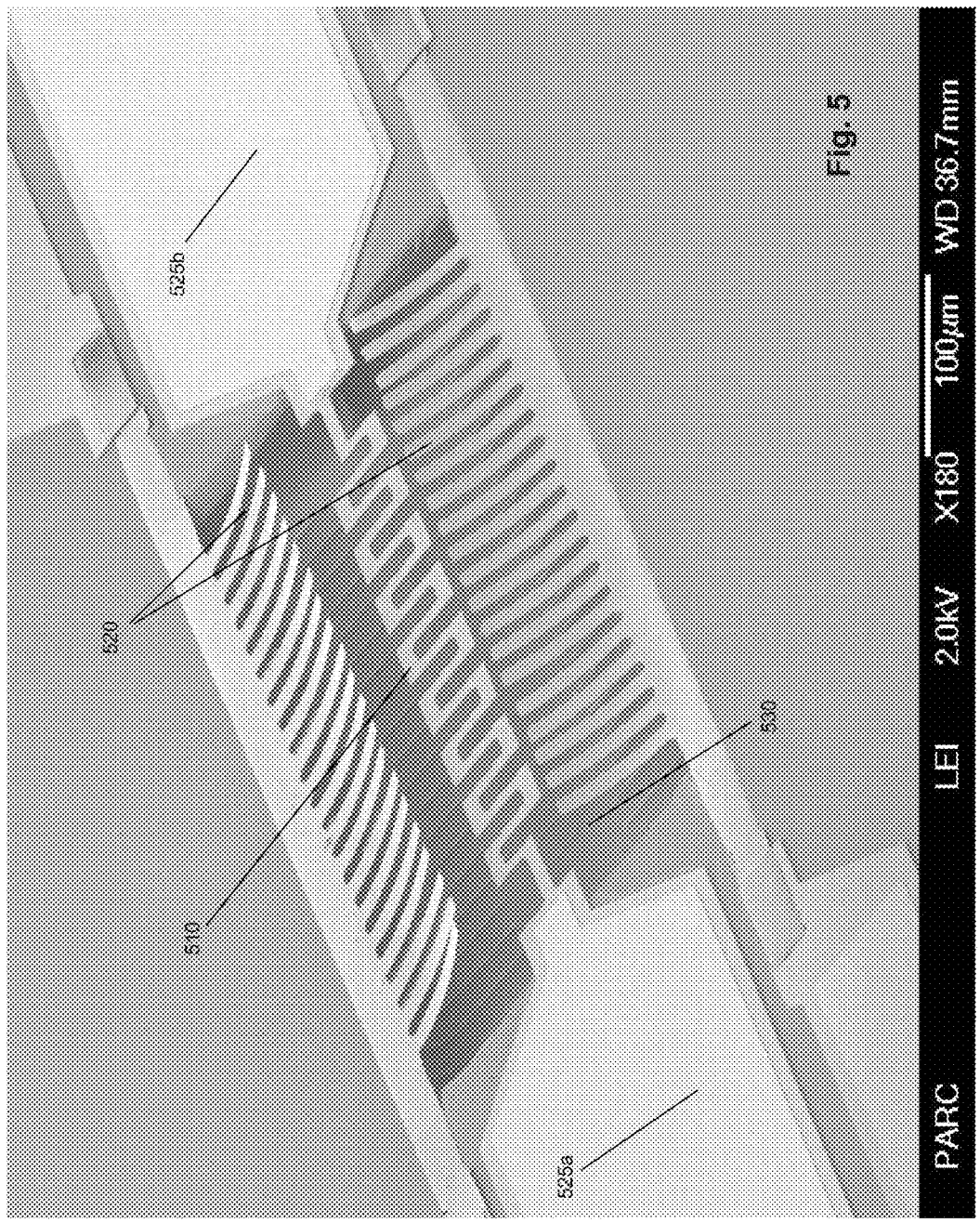
FIG. 5 shows scanning electron microscope (SEM) images of a top view of an exemplary bottom portion of an embodiment of an SEEF sensor.

Referring to FIG. 5, SEMs of an exemplary bottom portion of a SEEF sensor are illustrated. As shown, a serpentine-shaped, free-standing cathode 510 extends from a first bond pad 525a to a second bond pad 525b above a cavity 530 etched into a glass support structure. A number of steering electrodes 520 are shown extending from an outer side of the bottom portion towards the inner middle thereof. Each steering electrode 520 is shown to curl upwards as it extends toward the inner middle. The cathode 510 is therefore shown to be located on a horizontal plane below the curled-up ends of the steering electrodes 520.

Figure 6B:
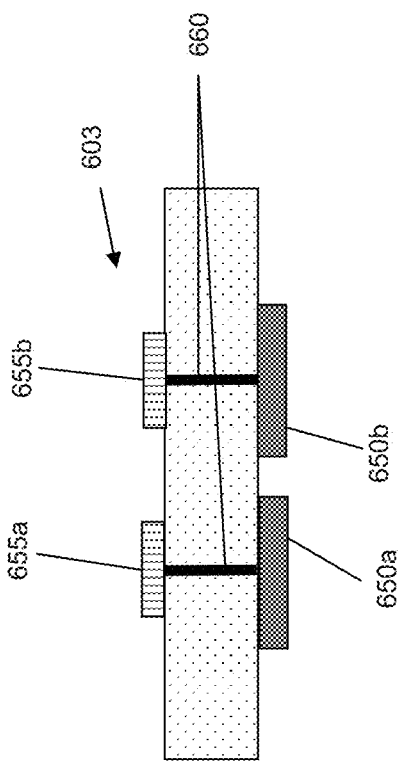
FIG. 6b illustrates a cross-sectional end view of a top portion of an exemplary SEEF sensor.
Figure 6A:
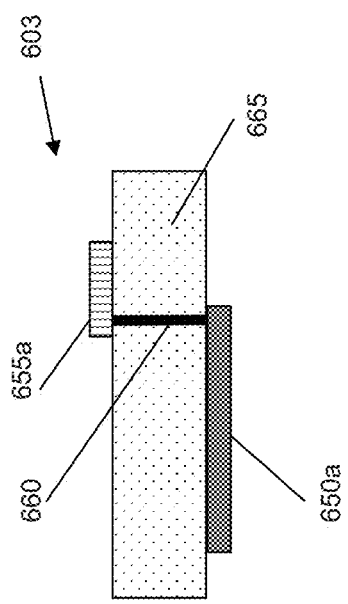
FIG. 6a illustrates a cross-sectional side view of a top portion of an exemplary SEEF sensor.

Referring to FIGS. 6a and 6b, a cross-sectional side view and cross-sectional end view of an exemplary top portion 603 of a SEEF sensor embodiment are illustrated, respectively. As shown, a pair of anodes (650a, 650b) are supported by a top portion support structure 665, which may comprise any non-conductive material, such as but not limited to soda lime glass, borosilicate glass, or fused quartz.

As shown, the anode pair (650a, 650b) is disposed on a bottom side of the top portion support structure 665. Generally, an anode may comprise any electrically conductive material, such as but not limited to gold, copper, tungsten, and/or silver.

Bond pads (655a, 655b) may be disposed on the top side of the top portion support structure 665, and may be placed in electrical communication using a via 660 or other means with the anodes (650a, 650b). The bond pads (655a, 655b) may be made of any suitable conductive material, such as but not limited to gold, silver, or platinum and may be placed in electrical communication (e.g., via one or more wires) with other electronics of an electric-field sensor. As shown, a via 660 connecting an anode 650a and a bond pad 655a may be run through an aperture in the top portion support structure 665. In this way, the anodes (650a, 650b) may be in electrical communication with a power source such that a positive voltage may be applied thereto.

Referring to FIGS. 7a-7i, a MEMS microfabrication technique for producing a top portion (e.g., FIG. 6 at 603) of an exemplary SEEF detector is illustrated. As shown in FIGS. 7a-7c, two apertures or vias may be cut (e.g., drilled or etched) into a top portion support structure 765 and filled with a conductive material 760 such as but not limited to gold, silver, tungsten, and other metals. The conductive material 760 may be present at both the top and bottom surface of the top portion support structure 765. In this way, a conductive material 754 on the top surface of the support structure 765 may be placed in electrical communication with a conductive material 751 on the bottom surface of the support structure and vice versa. In certain embodiments, a via 760 may run from the bottom surface of the support structure 765 to the top surface thereof.

Referring to FIGS. 7d-7f, a first conductive material 751 may be sputtered onto the bottom surface of the support structure. A second conductive material 754 may be sputtered onto the top surface of the support structure.

Referring to FIGS. 7g-7i, the first conductive material 751 may be patterned and etched to form two anodes (750a, 750b) having a space between them. In certain embodiments, the anodes are located a distance apart. The distance may be in the vertical or horizontal direction, but it is important the anodes do not touch. Typically, the first and second anode may be located a distance less than about 5 μm apart. In one embodiment, the first and second anodes may be located a horizontal distance of less than about 5 μm apart. In another embodiment, the anodes may overlap in the horizontal direction, but there remains a distance between them in the vertical direction of less than about 5 μm. In certain embodiments, the anodes may be located about 2 μm apart in either the vertical or horizontal direction.

The second conductive material 754 may be patterned and etched to form two bond pads 755a, 755b. The bond pads are each in electrical communication with an anode (e.g., bond pad 755a is in electrical communication with anode 750a; and bond pad 755b is in electrical communication with anode 750b) via the conductive material 760 filling the aperture in the support structure 765.

Figure 8:
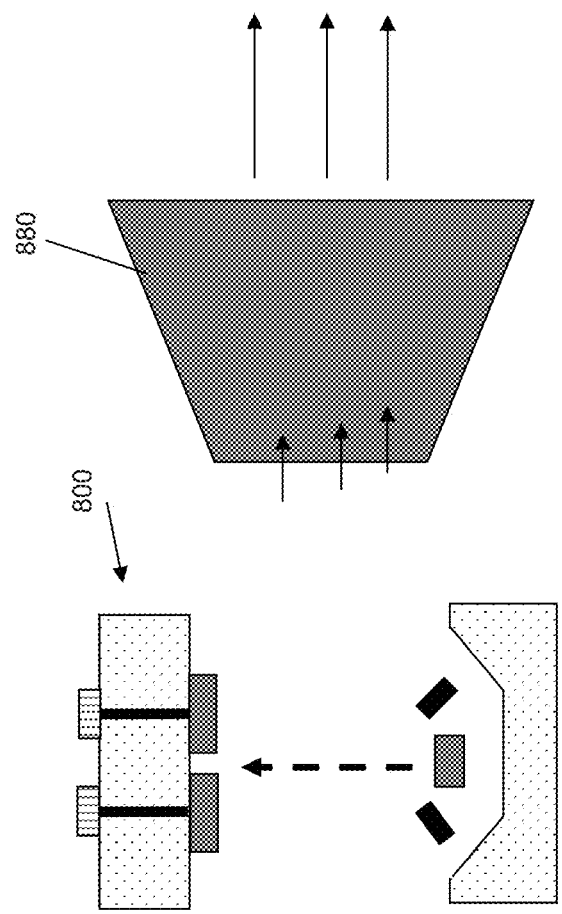
FIG. 8 illustrates a cross-sectional end view of an exemplary SEEF sensor having electric-field concentrators on either side thereof.

Referring to FIG. 8, an exemplary SEEF sensor 800 is shown between two electric-field concentrators 880. In one embodiment, one or more external field concentrators 880 may be employed to concentrate an external electric field 890 through the electric-field sensor 800. For example, as shown, one or more wedge-shaped blocks may be implemented as concentrators 880. The blocks are shown to comprise a large outer wall facing away from the SEEF sensor 800 and a small inner wall facing towards the electric-field sensor. The outer and inner walls are connected by a number of tapered side walls to form a solid structure. Such concentrators 880 may comprise a dielectric or metallic material, such as but not limited to copper, titanium, or Kovar. In practice, the concentrators 880 may be periodically shorted together to induce a chopping effect, periodically nulling the external electric field.

Generally, electric field lines 890 that enter the concentrator 880 at the outer wall of a concentrator may unintentionally leak from the tapered parts of the walls, in effect missing the SEEF sensor 800. According to one embodiment, the outer wall of the concentrator 880 may range from about 1 mm to about 10 mm, preferably from about 2 mm to about 5 mm. The inner wall of the concentrator 880 may range in height from about 1.5 mm to about 3 mm, preferably about 2 mm. The total width of a concentrator block may be from about 5 mm to about 15 mm, and preferably about 7 mm.

It has been found that the concentrator blocks 880 are generally more effective when placed closer together. In certain embodiments, the concentrators may be located from about 1 mm or less to about 5 mm apart, for example about 1.5 mm, 2 mm, or 3 mm apart. It will be appreciated that, no matter the distance, the concentrators 880 will be more effective when employed inside a vacuum package butted up against the SEEF sensor 800.

In certain embodiments, during operation, the concentrators 880 may be shorted together to short out and effectively block an external electric field 890 being sensed. This effectively mixes low-frequency signals to higher frequencies, where there is less noise, enabling the sensing of weaker low-frequency fields.

Figure 9:
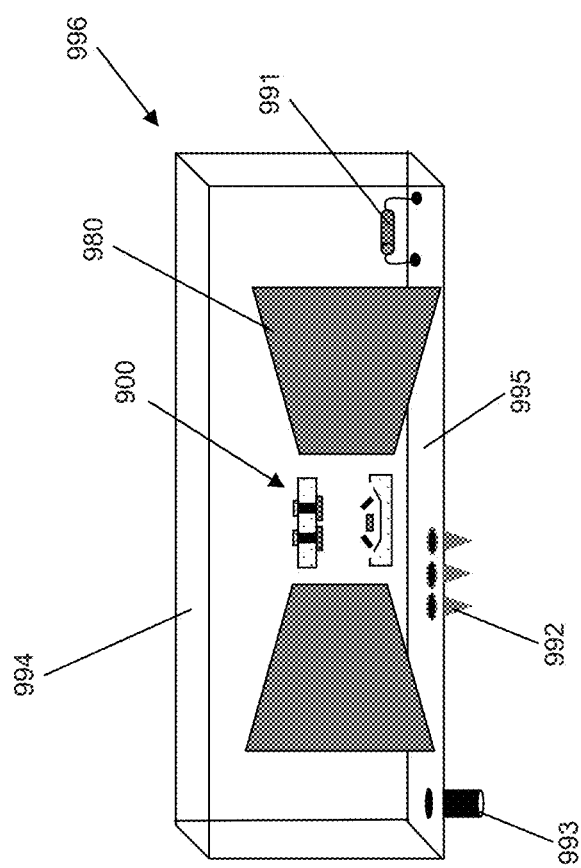
FIG. 9 illustrates an exemplary package having an exemplary SEEF sensor and concentrators contained therein.

Referring to FIG. 9, an exemplary SEEF sensor 900 may be provided as part of a package 996. In certain embodiments, the package 996 may comprise a lid 994 and a base 995 that, when joined together, form a hollow cube-like structure having an inner chamber. The SEEF sensor 900, along with optional concentrators 980, may be disposed within the inner chamber along with a getter cartridge 991. Getters 991 are reactive metals that chemically combine with residual or desorbed gases in the inner chamber, removing them to keep the pressure low. Some of the simplest getters 991 are titanium or barium, which can be resistively or RF heated and sublimated after the sensor is vacuum sealed. The resulting fresh titanium or barium surface reacts with residual gas molecules. Another class of getter 991 is non-evaporable getters, such as certain zirconium alloys. These getters may be heated, rather than sublimated, to activate them.

As shown, the lid 994 may form an air-tight (or nearly air-tight) seal with a base 995 of the package 996, by employing a sealant, such as but not limited to glass frit paste. Both the lid 994 and base 995 of the package may comprise any number of materials, and in one embodiment may comprise an aluminum oxide ceramic.

The base 995 of the package 996 may comprise any number of pins 992, bond pads, tubing 993, and/or other electrical or mechanical connections. As shown, the base 995 comprises a tube 993 such that air may be pumped out to create a vacuum within the inner chamber. Once a vacuum is created, the tube 993 may be pinched or crimped such that air may not enter the inner chamber. Generally, the SEEF sensor 900 and concentrators 980 may be attached to the base 995 using an adhesive, such as but not limited to an alumina-based adhesive.

In one embodiment, the lid 994 and base 995 may be joined together and then force may be applied thereto. While a force is applied, the package 996 may be placed in a heater block and heated to a temperature of about 375° C. Upon cooling, the lid and base may form an air-tight (or nearly air-tight) seal. In order to form a vacuum within the inner chamber, a pump may be secured to the tube 993 and the air may be pumped out. In certain embodiments, the package 996 may be "baked out" at about 200 to 400° C. and the getter may be activated at about 450° C. by flowing about 1.5 A to about 2.6 A therethrough. The entire package 996 may then be sealed by crimping off the tube 993. In one embodiment, an ion gauge (not shown) may be integrated in the package to determine the vacuum level within the inner chamber. A vacuum level of about $10^{-6}$ Torr or lower is currently preferred.

The invention described and claimed herein is not to be limited in scope by the specific embodiments herein disclosed since these embodiments are intended as illustrations of several aspects of the invention. Any equivalent embodiments are intended to be within the scope of this invention. Indeed, various modifications of the invention in addition to those shown and described herein will become apparent to those skilled in the art from the foregoing description. Such modifications are also intended to fall within the scope of the appended claims. All publications cited herein are incorporated by reference in their entirety.

We claim:

1. A steered-electron electric field (SEEF) sensor comprising:
   a bottom portion comprising:
      a non-conductive bottom portion support structure having a cavity disposed therein;
      a cathode capable of emitting electrons when activated, the cathode extending from the bottom portion such that it is at least partially suspended above the cavity; and
      a plurality of steering electrodes extending from a base at the bottom portion support structure to a tip located above the cathode;
   a top portion comprising:
      a non-conductive top portion support structure;
      a first anode disposed on the top portion support structure; and
      a second anode disposed on top portion support structure, the second anode located a distance from the first anode;
      wherein the first and second anodes are symmetrically positioned above the cathode; and
   a middle portion extending from the top portion support structure to the bottom portion support structure,
   wherein, upon activation of the cathode, electrons are emitted therefrom, and said electrons are received at the first and/or second anode.

2. A SEEF sensor according to claim 1, wherein the cathode comprises a metal material and a low-work-function material.

3. A SEEF sensor according to claim 2, wherein the low-work-function material is selected from the group consisting of thorium (Th), thorium oxide ($ThO_2$), barium (Ba), barium oxide (BaO), strontium (Sr), strontium oxide (SrO), calcium oxide (CaO), lanthanum (La), lanthanum oxide ($La_2O_3$), yttrium (Y), yttrium oxide ($Y_2O_3$), cesium (Ce), cesium oxide ($CeO_2$) and combinations thereof.

4. A SEEF sensor according to claim 3, wherein the low-work-function material is selected from the group consisting of BaO, SrO, CaO, La, $La_2O_3$, and combinations thereof.

5. A SEEF sensor according to claim 4, wherein the metal material is tungsten.

6. A SEEF sensor according to claim 5, wherein the cathode comprises from about 95% to about 99% tungsten and from about 1% to about 5% BaO, SrO, CaO, La, $La_2O_3$, or a combinations thereof.

7. A SEEF sensor according to claim 6, wherein the cathode comprises about 98% tungsten and about 2% BaO, SrO, CaO, La, $La_2O_3$, or a combination thereof.

8. A SEEF sensor according to claim 1, wherein said activating comprises heating the cathode.

9. A SEEF sensor according to claim 1, wherein said activating comprises illuminating the cathode.

10. A SEEF sensor according to claim 1, wherein said activating comprises applying an extraction electric field to the cathode.

11. A SEEF sensor according to claim 1, wherein the cathode comprises a serpentine shape.

12. A SEEF sensor according to claim 1, wherein the bottom portion support structure comprises soda lime glass.

13. A SEEF sensor according to claim 1, wherein each of the steering electrodes comprise a stress gradient through its thickness.

14. A SEEF sensor according to claim 1, wherein the middle portion comprises soda lime glass.

15. A SEEF sensor according to claim 1, wherein the second anode is located a distance of less than about 5 μm from the first anode.

16. A SEEF sensor according to claim 15, wherein the second anode is located a distance of about 2 μm from the first anode.

17. A SEEF sensor according to claim 1, further comprising electric field concentrators on either side thereof, the electric field concentrators adapted to concentrate an external electric field through a path of the electrons emitted from the cathode.

18. A SEEF sensor according to claim 17, wherein the electric filed concentrators comprise a wedge-shaped block having a large outer wall facing away from the SEEF sensor and a small inner wall facing towards the SEEF sensor, the outer and inner walls connected by a number of tapered side walls to form a solid structure.

19. A SEEF sensor according to claim 18, wherein the electric field concentrators comprise a metal or dielectric material.

20. A steered-electron electric field (SEEF) sensor package comprising:
    a base and lid sealably connected to form a hollow structure having an inner chamber therein;
    a SEEF sensor disposed within the inner chamber, the SEEF sensor comprising:
       a generally free-standing cathode capable of emitting electrons when activated;
       a first and second anode located a distance apart, the first and second anode symmetrically located from about 0.5 mm to about 5 mm from the cathode; and
       a plurality of steering electrodes at least partially disposed between the cathode and the first and second anode;
       wherein, upon activation of the cathode, electrons are emitted therefrom, and said electrons are received at the first and/or second anode; and
    electric field concentrators disposed within the inner chamber on two sides of the SEEF sensor, the electric field concentrators adapted to concentrate an external electric field through the electrons emitted from the cathode thereof.

21. A SEEF sensor package according to claim 20, wherein the electric filed concentrators comprise a wedge-shaped block having a large outer wall facing away from the SEEF sensor and a small inner wall facing towards the SEEF sensor, the outer and inner walls connected by a number of tapered side walls to form a solid structure.

22. A SEEF sensor package according to claim 21, wherein the electric field concentrators comprise a metal material.

23. A SEEF sensor package according to claim 21, wherein the electric field concentrators comprise a dielectric material.

24. A SEEF sensor package according to claim 20, wherein the inner chamber comprises a vacuum of less than about $10^{-6}$ Torr.

25. A SEEF sensor package according to claim 20, wherein the inner chamber comprises a getter material.

26. A SEEF sensor package according to claim 20, wherein the base and lid comprise a ceramic material.

27. A SEEF sensor package according to claim 20, wherein the cathode comprises a metal material and a low-work-function material.

28. A SEEF sensor package according to claim 27, wherein the low-work-function material is selected from the group consisting of thorium (Th), thorium oxide (ThO$_2$), barium (Ba), barium oxide (BaO), strontium (Sr), strontium oxide (SrO), calcium oxide (CaO), lanthanum (La), lanthanum oxide (La$_2$O$_3$), yttrium (Y), yttrium oxide (Y$_2$O$_3$), cesium (Ce), cesium oxide (CeO$_2$) and combinations thereof.

29. A SEEF sensor package according to claim 28, wherein the low-work-function material is selected from the group consisting of BaO, SrO, CaO, La, La$_2$O$_3$, and combinations thereof.

30. A SEEF sensor package according to claim 29, wherein the metal material is tungsten.

31. A SEEF sensor package according to claim 30, wherein the cathode comprises from about 95% to about 99% tungsten and from about 1% to about 5% BaO, SrO, CaO, La, La$_2$O$_3$, or a combinations thereof.

32. A SEEF sensor package according to claim 31, wherein the cathode comprises about 98% tungsten and about 2% BaO, SrO, CaO, La, La$_2$O$_3$, or a combination thereof.

33. A SEEF sensor package according to claim 20, wherein the cathode comprises a serpentine shape.

34. A SEEF sensor package according to claim 20, wherein the cathode is disposed above a cavity etched into a soda lime glass support structure.

35. A SEEF sensor package according to claim 20, wherein each of the steering electrodes comprise a stress gradient through its thickness.

36. A SEEF sensor package according to claim 20, wherein the second anode is located a distance of less than about 5 μm from the first anode.

37. A SEEF sensor package according to claim 36, wherein the second anode is located a distance of about 2 μm from the first anode.

38. A SEEF sensor package according to claim 20, wherein said activating comprises heating the cathode.

39. A SEEF sensor package according to claim 20, wherein said activating comprises illuminating the cathode.

40. A SEEF sensor package according to claim 20, wherein said activating comprises applying an extraction field to the cathode.

41. A method of determining an external electric field comprising:
    providing a steered-electron electric field (SEEF) sensor comprising:
        a bottom portion comprising:
            a non-conductive bottom portion support structure having a cavity disposed therein;
            a cathode capable of emitting electrons when activated, the cathode extending from the bottom portion such that it is at least partially suspended above the cavity; and
            a plurality of steering electrodes extending from a base at the bottom portion support structure to a tip located above the cathode;
        a top portion comprising:
            a non-conductive top portion support structure;
            a first anode disposed on the top portion support structure; and
            a second anode disposed on top portion support structure, the second anode located a distance of from the first anode;
            wherein the first and second anodes are symmetrically positioned above the cathode; and
        a middle portion extending from the top portion support structure to the bottom portion support structure;
    activating the cathode such that electrons are emitted therefrom; and
    measuring and comparing a first current at the first anode and a second current at the second anode to determine an external electric field.

42. A method according to claim 41, further comprising characterizing the external electric field.

43. A method according to claim 42, wherein said characterizing comprises characterizing the magnitude of the external electric field.

44. A method according to claim 41, further comprising converting the first current and second current to voltages.

45. A method according to claim 44 further comprising correcting for noise.

46. A method according to claim 41, wherein the cathode comprises a metal material and a low-work-function material.

47. A method according to claim 46, wherein the low-work-function material is selected from the group consisting of thorium (Th), thorium oxide (ThO$_2$), barium (Ba), barium oxide (BaO), strontium (Sr), strontium oxide (SrO), calcium oxide (CaO), lanthanum (La), lanthanum oxide (La$_2$O$_3$), yttrium (Y), yttrium oxide (Y$_2$O$_3$), cesium (Ce), cesium oxide (CeO$_2$) and combinations thereof.

48. A method according to claim 47, wherein the low-work-function material is selected from the group consisting of BaO, SrO, CaO, La, La$_2$O$_3$, and combinations thereof.

49. A method according to claim 48, wherein the metal material is tungsten.

50. A method according to claim 49, wherein the cathode comprises from about 95% to about 99% tungsten and from about 1% to about 5% BaO, SrO, CaO, La, La$_2$O$_3$, or a combination thereof.

51. A method according to claim 50, wherein the cathode comprises about 98% tungsten and about 2% BaO, SrO, CaO, La, La$_2$O$_3$, or a combination thereof.

52. A method according to claim 41, wherein the cathode comprises a serpentine shape.

53. A method according to claim 41, wherein the cathode is disposed above a cavity etched into a soda lime glass support structure.

54. A method according to claim 41, wherein each of the steering electrodes comprises a stress gradient through its thickness.

55. A method according to claim 41, wherein the second anode is located a distance of less than about 5 μm from the first anode.

56. A method according to claim 55, wherein the second anode is located a distance of about 2 μm from the first anode.

57. A method according to claim 41, wherein the SEEF sensor further comprises electric field concentrators on either side thereof and the electric field sensors are shorted to block the external electric field.

58. A method according to claim 41, wherein said activating comprises heating the cathode.

59. A method according to claim 41, wherein said activating comprises illuminating the cathode.

60. A method according to claim 41, wherein said activating comprises applying an extraction electric field to the cathode.

* * * * *